United States Patent [19]

Wilkinson

[11] 3,797,889

[45] Mar. 19, 1974

[54] WORKPIECE ALIGNMENT SYSTEM

[75] Inventor: Thomas Frank Wilkinson, Garland, Tex.

[73] Assignee: Texas Instruments Incorporated, Dallas, Tex.

[22] Filed: Dec. 30, 1971

[21] Appl. No.: 214,123

[52] U.S. Cl. .......... 302/2 R

[51] Int. Cl. .......... B65g 53/00

[58] Field of Search .......... 302/2 R, 29, 31; 198/33 R

[56] References Cited

UNITED STATES PATENTS

| | | | |
|---|---|---|---|
| 3,210,124 | 10/1965 | Niemi et al. | 302/2 R |
| 2,645,581 | 2/1972 | Lasch et al. | 302/2 R |

*Primary Examiner*—Richard E. Aegerter

*Assistant Examiner*—H. S. Lane

*Attorney, Agent, or Firm*—James O. Dixon; Gary C. Honeycutt

[57] ABSTRACT

A workpiece alignment system is particularly useful in the alignment of circular or cylindrical workpieces. The workpieces are provided with a flat edge along the circumference which flat edge is aligned in a preselected direction, thereby aligning the workpiece. The system is comprised of a body which includes apertures through which directional air jets flow carrying the workpiece on a directional air cushion to position the workpiece on the body; rotational air jet apertures for rotating the positioned workpiece until the flat edge is in the preselected direction; and flat sensing vacuum apertures for stopping the rotation of the workpiece when the flat edge is in the preselected direction and for providing a signal indicative of the alignment of the workpiece for the system.

9 Claims, 8 Drawing Figures

WORKPIECE ALIGNMENT SYSTEM

This invention relates to workpiece alignment systems, and more particularly to systems for aligning circular workpieces in a preselected direction.

The system of the invention is particularly useful, for example, in the alignment of semiconductor slices for photolithographic processing. In order to photolithographically process a semiconductor slice, a photoresist material is applied to the semiconductor slice and then selectively exposed to light utilizing a mask. The unexposed portions of the photoresist material are then removed to re-expose portions of the semiconductor material and the re-exposed semiconductor material is then processed such as by etching, doping, oxidation, etc. In the course of manufacturing semiconductor circuits and devices many of such photolithographic processes are required and in most cases it is desirable or necessary for the circular or cylindrical semiconductor slice to be aligned in the same direction for each selected exposure to ensure best alignment and to form regions which are in a desired relationship to each other such as a plurality of concentric regions. Utilizing the system of the present invention such semiconductor slices, provided with a flat edge, may always be automatically aligned in the same direction or a known selected direction during the manufacturing process.

It is therefore an object of the present invention to provide an improved system for the alignment of circular or cylindrical workpieces.

It is another object of the invention to provide a system for the alignment of circular or cylindrical workpieces whereby the workpieces may be automatically aligned in the same direction at each of a plurality of work stations.

It is a further object of the invention to provide a system for the alignment of circular semiconductor slices for photolithographic processing whereby the semiconductor slice is aligned for selective exposure.

These and other objects and advantages of the invention are achieved by providing a system comprising a body. The body includes directional air apertures for carrying the workpieces on a direction air cushion to position the workpieces on the body; rotational air jet apertures for rotating the workpieces once they have been positioned on the body; and flat sensing vacuum apertures for stopping the rotation of the workpieces once they have been aligned in a preselected direction and providing a signal indicative thereof for the system. The workpieces which are circular or cylindrical are provided with a flat edge along the circumference which flat edge is aligned with a flat member adjacent to the flat sensing vacuum apertures. The flat sensing vacuum apertures are positioned in the body such that the workpieces cover the vacuum apertures and the rotation of the workpiece is stopped by a reduced pressure suction generated in such vacuum apertures only when the flat edge of the rotating workpieces is positioned against the flat member adjacent to the flat sensing vacuum apertures. The system may also include a movable gate member which is utilized in the initial positioning of the workpiece on the body and for releasing the workpiece after desired operations in the aligned position have taken place to the workpiece.

In one embodiment, the body comprises a movable chuck member which cooperates with an air jet conveyor system such as an air track. The movable chuck member includes a plurality of vacuum transfer apertures in which a reduced pressure suction is generated to clamp the workpiece to the chuck member in the aligned position while the chuck member carrying the workpiece is being moved. The chuck member may be moved to a position in the air track to receive a workpiece and then be moved with the aligned workpiece to a work station such as an exposure station where, for example, a semiconductor slice is selectively exposed utilizing a mask. When the chuck member is positioned in the air jet conveyor system, the workpieces are carried to the chuck member by air jets along the air track, onto the chuck member by the directional air jets of the chuck member, out of the chuck member by the directional air jets of the chuck member when the movable gate member is opened and further along the air track by the air jets along the air track. Furthermore, a plurality of such chuck members may be provided on a pivotably mounted arm such that one chuck member is positioned in the air track to receive or release a workpiece while the other chuck member is positioned at the work station where a desired operation is performed to the aligned workpiece.

Alternately, the body itself may comprise an alignment portion of an air jet conveyor system such as the air track whereby the workpieces are carried to the alignment portion by air jets along the air track, onto the alignment portion by the directional air jets, out of the alignment portion by the directional air jets when the movable gate member is opened and further along the air track by the air jets along the air track. In such an embodiment desired operations may be performed to the workpiece while it is in the aligned position on the alignment portion of the air track.

Furthermore, a plurality of such alignment portions or chuck members may be provided in a system, such as the automated semiconductor processing system described in co-pending Pat. application Ser. No. 845,733 filed July 29, 1969, assigned to the assignee of the present invention, and hereby incorporated by reference. The workpieces may then be aligned in the same preselected direction at each of a number of work stations where, for example, photolithographic exposures take place and the work stations may be linked by one or more air tracks.

Still further objects and advantages of the invention will be apparent from the detailed discussion and claims when read in conjunction with the drawings wherein:

In accordance with the present invention, an alignment system includes a body having a plurality of directional air jet apertures for carrying workpieces on a directional air cushion to position the workpieces on the body; rotational air jet apertures for rotating the workpiece once it has been positioned on the body; and vacuum apertures for stopping the rotation of the workpiece once it has been aligned in a preselected direction. In accordance with one embodiment of the invention and as illustrated in FIGS. 1–5, the body comprises a movable chuck member 10 which is utilized in a semiconductor manufacturing system wherein a circular semiconductor slice, provided with a flat edge along the circumference, is aligned on the chuck member 10, clamped to the chuck member 10, and moved to an expose machine where a photoresist material covering the semiconductor slice is selectively exposed through a mask while the slice is in the aligned position on the chuck member 10. The chuck member 10 includes the plurality of directional air apertures 11, the plurality of rotational air jet apertures 12, and the vacuum apertures 13.

Figure 1:
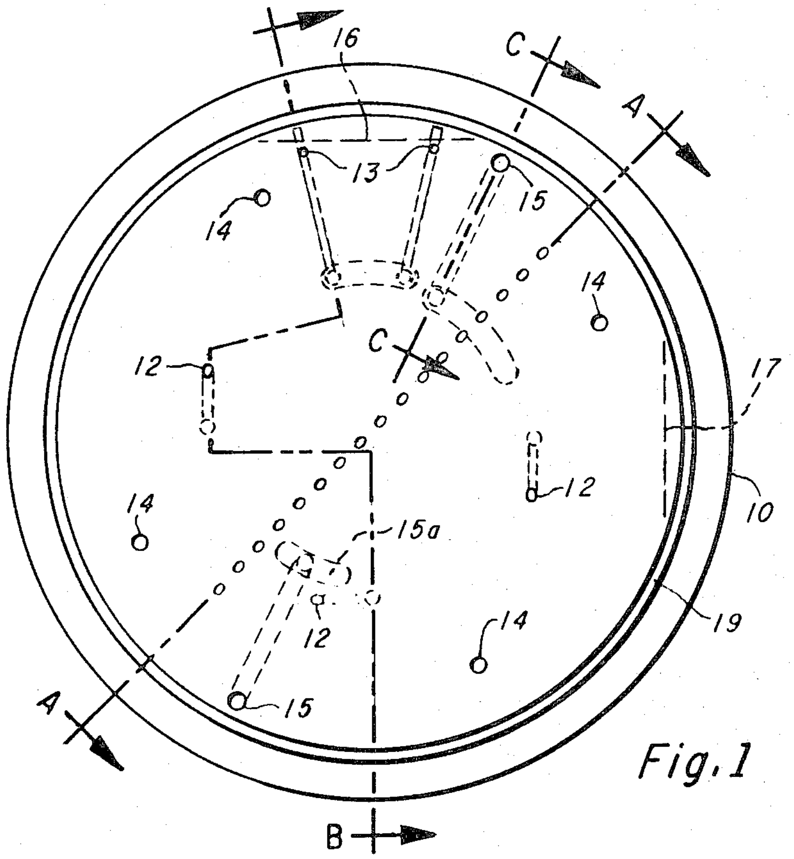
FIG. 1 is a top view of a chuck member comprising an embodiment of the system according to the present invention.
Figure 7:
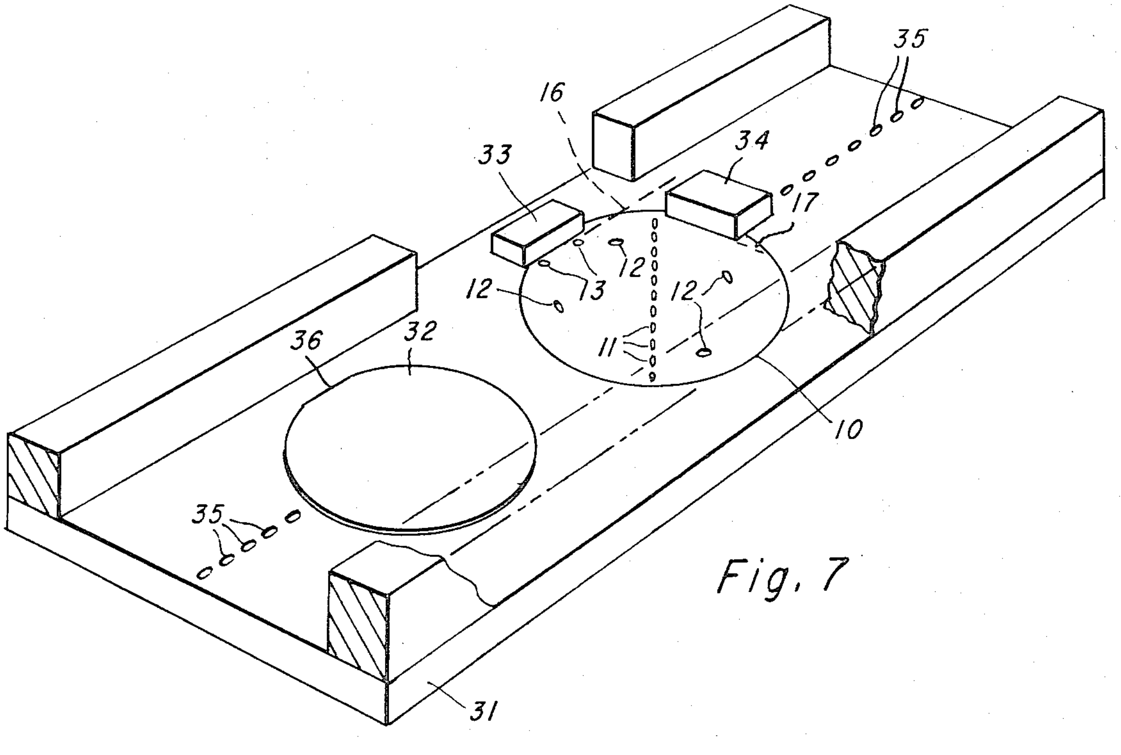

Referring to FIG. 1, a first flat member 22 is provided along the dotted line 16 and a second member 34 is provided along the dotted line 17. The members 33 and 34 which are illustrated in the embodiment of FIG. 7 are fixed to, for example, an air track 31 which carries the workpiece which in the present embodiment is a semiconductor slice 32 into and out of the chuck member 10. The semiconductor slice is carried on a directional air cushion toward the dotted lines 16 and 17 by compressed air flowing through the directional air jet apertures 11 which are angled at about 30° from the surface of the chuck member in the direction of the dotted lines 16 and 17. The semiconductor slices are positioned on the chuck member when the slices are carried into contact with both the first flat member 33 along the dotted line 16 and the second member 34 along the dotted line 17. Once the slice is in contact with both of these members it can move no further in the direction of the directional air cushion. Then, the semiconductor slice is rotated on an air cushion provided by compressed air flowing through rotational air jet apertures 12. The air jet apertures 12 are also angled at about 30° from the surface of the chuck member in the desired direction of rotation. A reduced pressure suction is generated in the vacuum apertures 13 while the slice is rotating. The slices are aligned when the flat edge 36 of the slices 32 are rotated into contact with the first flat member 33 along the dotted line 16. Because of the members 33 and 34 along the dotted lines 16 and 17 respectively, the circular slice does not cover the vacuum apertures 13 unless the flat edge 36 of the semiconductor slice 32 is in contact with the flat member 33 and the flat edge 36 is aligned in the direction of the dotted line 16.

Figure 2:
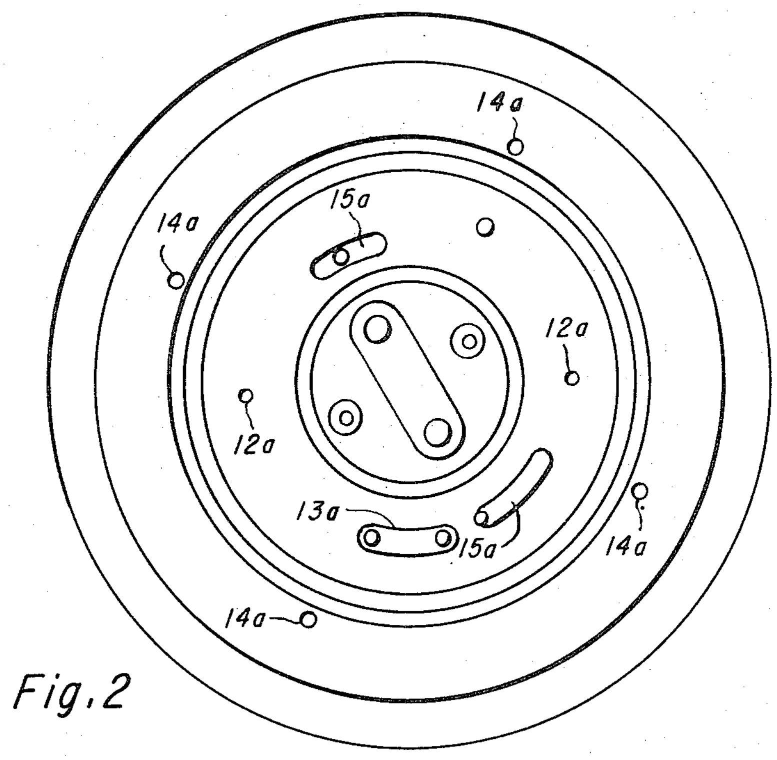
FIG. 2 is a bottom view of the chuck member of FIG. 1.

Referring to FIG. 2, a bottom view of the chuck member 10 is shown. The compressed air is applied to directional air jet apertures 11 through the opening 11*a*, to the rotational air jet apertures 12 through the openings 12*a*, and the reduced pressure suction generated in vacuum apertures 13 is provided at opening 13*a*. Additionally, where the chuck member is a movable member, vacuum transfer apertures 14 are provided in which a reduced pressure suction is generated to clamp the workpiece to the chuck member 10 in the aligned position while the chuck member 10 carrying the semiconductor slice 32 is being moved. The reduced pressure suction, generated in apertures 14, is provided through openings 14*a* on the bottom side of the chuck member 10. Furthermore, where the chuck member 10 is to carry the aligned semiconductor slice into an exposure machine for the selective exposure of a photoresist material coated on the slice, additional vacuum apertures 15 are provided and a flexible ring (not shown) of plastic or rubber, for example, provided so that a mask (typically made of glass) may be held firmly against the slice when the air is pumped out of apertures 15. The air is pumped out of apertures 15 from the bottom side of the chuck member 10 through openings 15*a*.

Figure 3:
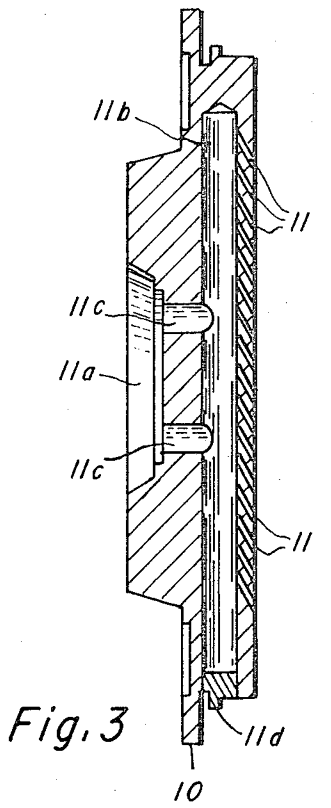
FIGS. 3–5 are various detailed sectional views of the chuck member of FIG. 1.

FIG. 3 is a sectional view taken through section A-A of FIG. 1. The apertures 11 are shown at about a 30° angle to the surface of the chuck member 10 to provide the directional air system. Apertures 11 are, for example, about 0.020 inches in diameter drilled into a chamber 11*b*. The chamber 11*b* is drilled into the side of the chuck member 10 and sealed with solder 11*d*, for example. Two additional apertures 11*c* are drilled from the bottom of the chuck member into the chamber 11*b*. Compressed air is pumped through the opening 11a through apertures 11*c* into chamber 11*b* and out of the various directional air jet apertures 11.

Figure 4:
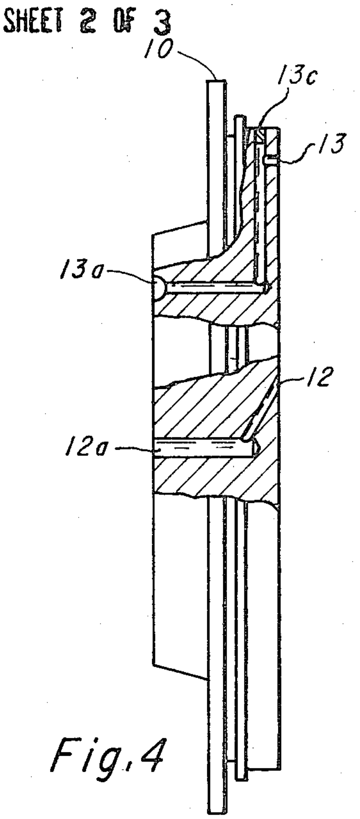

FIG. 4 is a sectional view taken through section B—B of FIG. 1 illustrating in particular one of the rotational air jet apertures 12 through which compressed air is pumped through opening 12*a* from the bottom of the chuck member. Also illustrated in FIG. 4 is a detailed view of the vacuum aperture 13 which is 0.032 inches in diameter, for example, drilled from the top of the chuck member 10 into a chamber 13*b*. Chamber 13*b* is drilled from the side of the chuck member 10 and is sealed by solder 13*c*, for example. Opening 13*a* is provided to the chamber 13*b* which is coupled to a vacuum pump to provide the necessary reduced pressure suction for aperture 13.

Figures 5, 8:
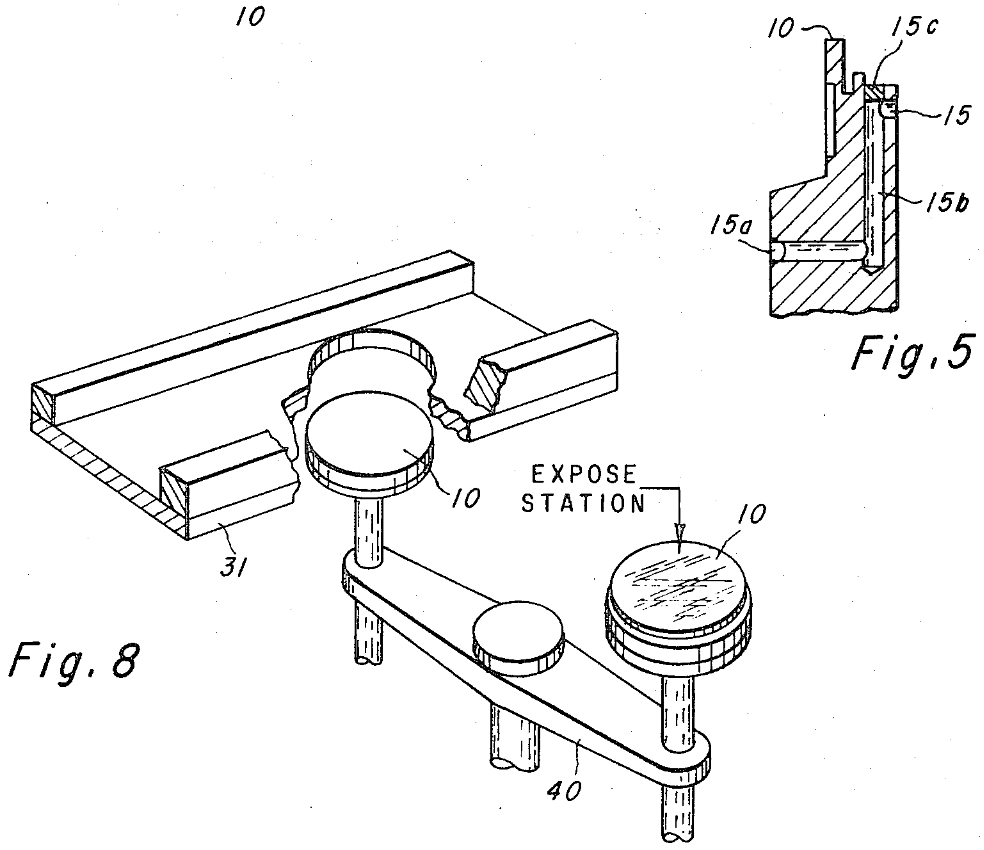
FIGS. 7 and 8 are isometric views of portions of automated semiconductor assembly lines utilizing various embodiments of the invention.

FIG. 5 is a sectional view through the section C—C of FIG. 1 showing in detail the aperture 15 which is utilized in the present embodiment to provide firm contact between a photoresist material coated on a semiconductor slice and a glass mask when a reduced pressure suction is provided at the opening 15*a* as previously discussed. The aperture 15 is 0.062 inches in diameter, for example, drilled from the top surface of the chuck member 10 into a chamber 15*b*. The chamber 15*b* is drilled in a similar manner to the chamber 13*b* and is sealed with solder 15*c*, for example.

Figure 6:
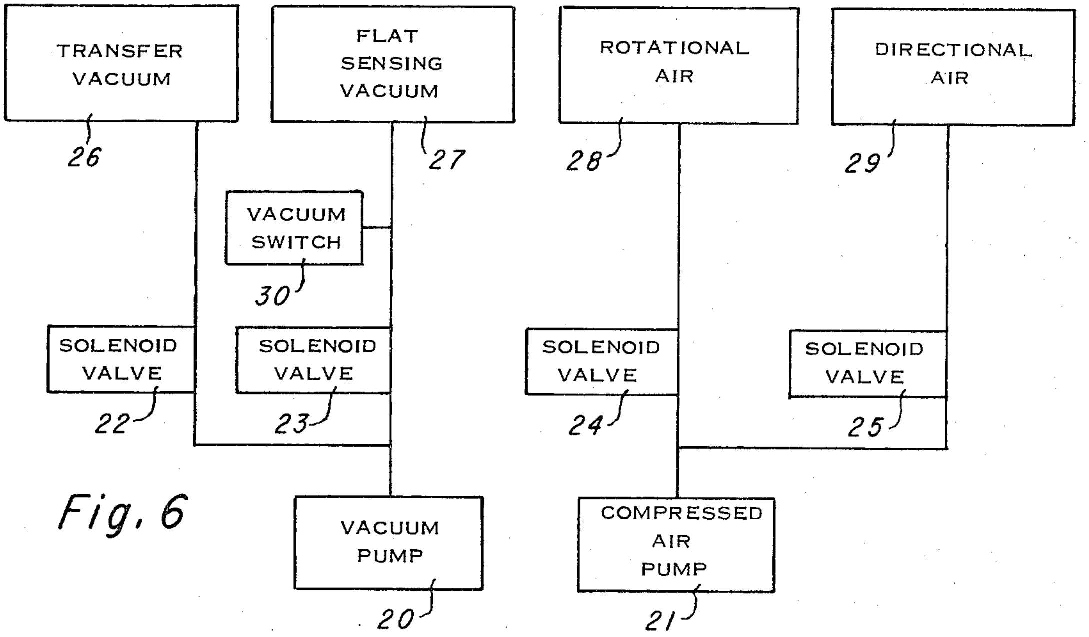
FIG. 6 is a block diagram of an embodiment of the system of the present invention.

Referring to FIG. 6, the system of the present invention includes a reduced pressure suction pump such as a vacuum pump 20 and a compressed air pump 21. The flat sensing vacuum 27 is provided for apertures 13 when solenoid valve 23 is opened. When the semiconductor slice is rotated into the aligned position, the slice completely covers vacuum apertures 13 causing the rotation of the slice to stop and causing the pressure of the flat sensing vacuum to build up in the vacuum line and throw vacuum switch 30 which provides a signal indicative of the alignment of the slice for the system. The transfer vacuum 26 for the transfer vacuum apertures 14 is also provided by vacuum pump 20 when the solenoid valve 22 is opened. The rotational air 28 and the directional air 29 for the rotational air jet apertures 12 and the directional air jet apertures 11, respectively, is provided by the compressed air pump 21 and controlled by the solenoid valves 24 and 25, respectively.

Referring to FIG. 7 in conjunction with FIG. 6, one method of operating the described system is as follows. Solenoid valve 25 is opened thereby providing directional air to the directional air apertures 11. A semiconductor slice 32 on an air track 31, for example, is carried to the apertures 11 by air jets 35, and then is carried by the directional air jets provided by apertures 11 onto the chuck member 10 until the semiconductor slice makes contact with both the first flat member 33 and the second flat member 34. Then, the solenoid valve 24 is opened and rotational air 28 is provided through apertures 12 causing the semiconductor slice 32 to rotate in the direction of the air flow through apertures 12 which are angled with respect to the top surface of the chuck member 10. Additionally, solenoid valve 23 is opened providing a reduced pressure suction at the vacuum apertures 13. The semiconductor slice 32 continues to rotate until the flat edge 36 is in contact with the flat member 33. At this time, the semiconductor slice covers the apertures 13 and the reduced pressure suction causes the rotation of the slice to stop. Additionally, because the semiconductor slice is covering apertures 13, pressure is built up in the vacuum line to the apertures 13 causing vacuum switch 30 to be activated. The vacuum switch 30 then provides a signal for the system indicating that the semiconductor slice has been aligned and the solenoid valves 24 and 25 are closed. A solenoid valve 22 is opened providing a reduced pressure suction to apertures 14 to firmly clamp the aligned semiconductor slice to the chuck member 10 so that the chuck member 10 may be moved without disturbing the alignment of the semiconductor slice. The solenoid valve 23 may then be closed. In the embodiment of FIG. 7, the member 34 is a movable gate member. When the desired operations have been performed to the aligned slice, the member 34 is raised and the solenoid valve 25 opened to release the slice from chuck member 10. The slice is then carried down the air track 31 by air jets 35.

Referring to FIG. 8, one system embodying the present invention utilizes the air track 31 and two chuck members 10 mounted on a pivotable arm 40. The chuck members 10 may be raised or lowered with respect to the arm 40. The arm 40 is pivoted so that one of the chuck members 10 is below an opening in the air track 31 and then raised to the level of the air track so that the top surface of the chuck member is flush with the surface of the air track while the other of the chuck members 10 carrying an aligned semiconductor slice is positioned at a work station such as an expose station 39 where a photoresist material coating the semiconductor slice is selectively exposed to light through a mask with the semiconductor slice in the aligned position. The chuck member positioned in the air track may release an exposed slice and receive a new slice while the other chuck member is at the expose station. The chuck members 10 are then lowered and arm 40 pivoted so that the chuck members reverse positions; the chuck member from the air track carrying a new slice to the expose station 39 and the chuck member from the expose station carrying the exposed slice to the air track.

Various embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention, will, without departing from the spirit and scope of the invention, be apparent to persons skilled in the art.

What is claimed is:

1. A system for positioning and aligning a circular workpiece having an irregular circumference at one region along its circumference comprising, in combination:

a. a pair of stop members, and
b. a body,
c. said stop members being so positioned relative to said body as to position a workpiece on said body when both of said stop members are in contact with the circumference of said workpiece and in a desired aligned position only when the irregular portion of the circumference of said workpiece is in contact with one of said stop members,
d. said body having
   i. a surface on which a workpiece is received for positioning and aligning,
   ii. a plurality of fluid passages communicating with said surface and a source of pressurized fluid and being so arranged and positioned to produce an upwardly inclined and directional fluid jet flow to urge said workpiece into contact with both said stop members,
   iii. a second plurality of fluid passages communicating with said surface and a source of pressurized fluid and so arranged and positioned to produce an upwardly inclined and tangential fluid jet flow to rotate said workpiece while being so urged, and
   iv. A third plurality of fluid passages communicating with said surface and a source of partial vacuum and positioned to be within the circumference of the vertical projection of said workpiece onto said surface only when both said stop members are in contact with the circumference of said workpiece and said irregular portion of the circumference of said workpiece is in contact with said one of said stop members, whereby when said workpiece moves into said desired aligned position said third plurality of passages are covered by said workpiece and produce a suction sufficient to draw said workpiece into contact with said surface and stop said workpiece in said desired aligned position.

2. The alignment system according to claim 1 including a vacuum switch coupled to said third plurality of passages wherein a change in pressure caused by the workpiece covering said passages activates said vacuum switch thereby indicating that the workpiece is aligned.

3. The alignment system according to claim 1 wherein said body comprises a movable chuck member further having a fourth plurality of fluid passages communicating with said surface and a source of partial vacuum and so positioned and arranged to produce a suction for holding said workpiece aligned when moving said chuck member.

4. A system for positioning and aligning a circular workpiece having a flat edge at one region along its circumference comprising, in combination:

a. a pair of flat stop members, and
b. a body,
c. said stop members being so positioned relative to said body as to position a workpiece on said body when both of said stop members are in contact with the circumference of said workpiece and in a desired aligned position when the flat edge of said workpiece is in contact with one of said stop members, d. said body having i. a surface on which a workpiece is received for positioning and aligning ii. a plurality of fluid passages communicating with said surface and means selectively to supply a pressurized fluid to said passages, said passages being so arranged and positioned to produce from said fluid an upwardly inclined and directional fluid jet flow to urge said workpiece into contact with both said stop members, iii. a second plurality of fluid passages communicating with said surface and means selectively to supply a pressurized fluid to said second plurality of passages, said second plurality of passages being so arranged and positioned to produce from said fluid an upwardly inclined and tangential fluid jet flow to rotate said workpiece while being so urged, iv. a third plurality of fluid passages communicating with said surface and means selectively to supply a partial vacuum to said third plurality of passages, said third plurality of passages being so positioned and arranged to be within the circumference of the vertical projection of said workpiece onto said surface only when both said stop members are in contact with the circumference of said workpiece and said flat edge of said workpiece is in contact with said one of said stop members, whereby, when said workpiece moves into said desired aligned position said third plurality of passages are covered by said workpiece and produce a suction sufficient to draw said workpiece into contact with said surface and stop said workpiece in said desired aligned position.

5. The alignment system according to claim 4 including a vacuum switch coupled to said third plurality of passages wherein a change in pressure caused by the workpieces covering said passages activates said vacuum switch thereby indicating that the workpieces are aligned.

6. The alignment system according to claim 4 wherein said body comprises a movable chuck member further having a fourth plurality of fluid passages communicating with said surface and arranged to produce a partial vacuum for holding workpieces when moving said chuck member.

7. A system for positioning and aligning a circular workpiece having an irregular circumference at one region along its circumference comprising, in combination:

a. a guideway having a major surface and an opening therein, b. a movable chuck member having a major surface, said chuck member being movable into said opening until the major surface of said chuck member is essentially coplanar with the major surface of said guideway, c. said guideway further having i. a plurality of fluid passages communicating with said guideway major surface and a source of pressurized fluid and so arranged along said guideway major surface as to produce an upwardly inclined and directional fluid jet flow to urge a workpiece on said guideway toward said opening, and ii. a pair of stop members so positioned adjacent said opening as to position a workpiece on said chuck member occupying said opening when both sait stop members are in contact with the circumference of said workpiece and in a desired aligned position only when the irregular portion of said circumference of said workpiece is in contact with one of said stop members, d. said chuck member further having i. a plurality of fluid passages communicating with said surface and a source of pressurized fluid and being so arranged and positioned to produce an upwardly inclined and directional fluid jet flow to urge said workpiece into contact with both said stop members, ii. a second plurality of fluid passages communicating with said surface and a source of pressurized fluid and so arranged and positioned to produce an upwardly inclined and tangential fluid jet flow to rotate said workpiece while being so urged, iii. a third plurality of fluid passages communicating with said surface and a source of partial vacuum and positioned to be within the circumference of the vertical projection of said workpiece onto said major surface only when both said stop members are in contact with the circumference of said workpiece and said irregular portion of the circumference of said workpiece is in contact with said one of said stop members whereby when said workpiece moves into said desired aligned position said third plurality of passages are covered by said workpiece and produce a suction sufficient to draw said workpiece into contact with said surface and stop said workpiece in said desired aligned position, and iv. a fourth plurality of fluid passages communicating with said major surface and a source of partial vacuum and so positioned and arranged to produce a suction holding said workpiece in said desired aligned position on said chuck member when said chuck member is moved.

8. The alignment system according to claim 7 including another chuck member of substantially the same construction as said first chuck member, said chuck members being mounted on opposite sides of a pivotably mounted arm wherein each of said chuck members is movable into said opening and into a work station.

9. The alignment system according to claim 7 including a vacuum switch coupled to said third plurality of passages wherein a change in pressure caused by the workpieces covering said passages activates said vacuum switch thereby indicating that the workpieces are aligned.

* * * * *